United States Patent
Cong et al.

(10) Patent No.: US 12,519,005 B2
(45) Date of Patent: Jan. 6, 2026

(54) THICKNESS UNIFORMITY IMPROVEMENT KIT FOR THERMALLY SENSITIVE EPITAXIAL PROCESSING

(71) Applicant: Applied Materials, Inc., Santa Clara, CA (US)

(72) Inventors: Zhepeng Cong, San Jose, CA (US); Ashur J. Atanos, San Jose, CA (US); Nimrod Smith, Cupertino, CA (US); Richard O. Collins, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 696 days.

(21) Appl. No.: 17/875,302

(22) Filed: Jul. 27, 2022

(65) Prior Publication Data
US 2024/0038575 A1    Feb. 1, 2024

(51) Int. Cl.
*H01L 21/687* (2006.01)
*C23C 16/458* (2006.01)
(Continued)

(52) U.S. Cl.
CPC .... *H01L 21/68742* (2013.01); *C23C 16/4583* (2013.01); *C30B 25/12* (2013.01)

(58) Field of Classification Search
CPC ......... H01L 21/68742; H01L 21/68785; H01L 21/67109; H01L 21/68707;
(Continued)

(56) References Cited

U.S. PATENT DOCUMENTS 5,820,685 A * 10/1998 Kurihara ................. C30B 31/14
                                                                118/728
10,381,258 B2 * 8/2019 Umise ............... H01L 21/68742
(Continued)

FOREIGN PATENT DOCUMENTS

CN    112974180 A  *  6/2021  ............. B05D 3/007
JP    2001313329 A  * 11/2001  ....... H01L 21/68735
(Continued)

OTHER PUBLICATIONS

WO2024025614A1 (Search Report) (Year: 2024).*
PCT/US2023/010217, International Search Report and Written Opinion dated May 2, 2023, 10 pages.

*Primary Examiner* — Mahdi H Nejad
(74) *Attorney, Agent, or Firm* — Patterson + Sheridan, LLP (57) ABSTRACT

Embodiments described herein relate to a susceptor kit. The susceptor kit includes a susceptor support plate including a plurality of susceptor lift pin holes and a plurality of susceptor support holes, a plurality of susceptor supports recessed within the plurality of susceptor support holes and coupled to the susceptor support plate, and a lift pin assembly. The plurality of susceptor supports receive a plurality of susceptor support pins. The support body supports the support pin link in a spaced apart relation to the susceptor support plate. The lift pin assembly is received in the plurality of susceptor lift pin holes. The lift pin assembly includes a lift pin cap and a susceptor lift pin comprising a susceptor stop plate. The susceptor support plate stop is receivable within the susceptor lift pin holes.

20 Claims, 8 Drawing Sheets

(51) Int. Cl.
*C30B 25/12* (2006.01)
*H01L 21/67* (2006.01)

(58) Field of Classification Search
CPC ......... H01L 21/68792; H01L 21/67103; C30B 25/12; C23C 16/4586; H01J 37/32715
USPC .................................. 118/728, 724; 269/54
See application file for complete search history.

(56) References Cited

U.S. PATENT DOCUMENTS

| | | | |
|---|---|---|---|
| 10,431,488 B2 | 10/2019 | Yoon et al. | |
| 12,020,977 B2 * | 6/2024 | Sulyman | H01L 21/68785 |
| 12,347,719 B2 * | 7/2025 | Sovenahalli | H01L 21/68742 |
| 2003/0178145 A1 * | 9/2003 | Anderson | H01L 21/68735 |
| | | | 118/728 |
| 2005/0155823 A1 * | 7/2005 | Hiroki | H01L 21/6875 |
| | | | 187/401 |
| 2007/0119367 A1 * | 5/2007 | Kanaya | C30B 25/02 |
| | | | 427/248.1 |
| 2009/0250855 A1 | 10/2009 | Fujii et al. | |
| 2011/0097900 A1 * | 4/2011 | Augustino | H01J 37/32467 |
| | | | 428/80 |
| 2014/0216332 A1 * | 8/2014 | Omori | H01L 21/68742 |
| | | | 118/50 |
| 2017/0221747 A1 * | 8/2017 | Huang | H01L 21/68742 |
| 2017/0301579 A1 * | 10/2017 | Hosaka | H01L 21/68742 |
| 2019/0051555 A1 * | 2/2019 | Hill | H01L 21/68742 |
| 2019/0311941 A1 * | 10/2019 | Moos | H01L 21/68742 |
| 2019/0355612 A1 | 11/2019 | Sakurai | |
| 2020/0058538 A1 * | 2/2020 | Ghosh | H01L 21/68757 |
| 2021/0005504 A1 * | 1/2021 | Han | H01L 21/68785 |
| 2021/0358797 A1 * | 11/2021 | Sovenahalli | H01L 21/68742 |
| 2023/0215705 A1 * | 7/2023 | Jeong | H01L 21/68742 |
| | | | 156/345.54 |
| 2024/0035160 A1 * | 2/2024 | Ishikawa | C23C 16/4581 |
| 2025/0105048 A1 * | 3/2025 | Tokunaga | C23C 16/325 |

FOREIGN PATENT DOCUMENTS

| | | | | |
|---|---|---|---|---|
| JP | 2021097162 A | | 6/2021 | |
| JP | 2023165539 A | * | 11/2023 | ....... H01L 21/68742 |
| KR | 20110045327 | * | 5/2011 | ....... H01L 21/37017 |
| KR | 20110045327 A | * | 5/2011 | ....... H01L 21/67017 |
| KR | 20220009550 A | * | 1/2022 | |
| WO | WO-2017130809 A1 | * | 8/2017 | ....... H01L 21/68721 |

* cited by examiner

THICKNESS UNIFORMITY IMPROVEMENT KIT FOR THERMALLY SENSITIVE EPITAXIAL PROCESSING

BACKGROUND

Field

Embodiments of the present disclosure generally relates to thermal processing of thin films on substrates, such as silicon wafers. More specifically, the embodiments of the disclosure relates to processing kits for epitaxial deposition.

Description of the Related Art

In solid-state integrated circuit fabrication, epitaxial processing is typically performed in an epitaxial processing chamber. A substrate disposed on a substrate support in the epitaxial processing chamber is typically heated by lamps positioned over and/or under the substrate.

However, during processing, various chamber components can create shadowing on the substrate support. This shadowing obstructs the heat from the lamps used to heat the substrate support and the substrate, causing non-uniform temperature distribution and consequently non-uniform deposition. Therefore, there is a need for an improved hardware for epitaxial deposition.

SUMMARY

The present disclosure generally relates to thermal processing of thin films on substrates, such as silicon wafers. More specifically, the embodiments of the disclosure relates to processing kits for epitaxial deposition.

In one embodiment, a susceptor kit includes a susceptor support plate, a plurality of susceptor supports, and a lift pin assembly. The susceptor support plate includes a plurality of susceptor lift pin holes and a plurality of susceptor support holes. The plurality of susceptor supports are recessed within the plurality of susceptor support holes and coupled to the susceptor support plate. The plurality of susceptor supports each include two or more susceptor support pins to support a substrate support. The susceptor lift pin assembly received in the plurality of susceptor lift pin holes.

In another embodiment, a susceptor kit includes a susceptor support plate, a plurality of susceptor supports, and a lift pin assembly. The susceptor support plate includes a plurality of susceptor lift pin holes and a plurality of susceptor support holes. The plurality of susceptor supports are recessed within the plurality of susceptor support holes and are coupled to the susceptor support plate. Each of the plurality of susceptor supports include two or more susceptor support pins support a substrate support. The lift pin assembly receives in the plurality of susceptor lift pin holes.

In another embodiment, a susceptor kit includes a susceptor support plate including a plurality of susceptor lift pin holes and a plurality of susceptor support holes, a plurality of susceptor supports recessed within the plurality of susceptor support holes and coupled to the susceptor support plate, and a lift pin assembly. The plurality of susceptor supports include a support body and a support pin link. A support connector is received by a support anchor of the susceptor support plate to secure the support body to the susceptor support plate. The support pin link receives a plurality of susceptor support pins. The support body supports the support pin link in a spaced apart relation to the susceptor support plate. The lift pin assembly is received in the plurality of susceptor lift pin holes. The lift pin assembly includes a lift pin cap and a susceptor lift pin comprising a susceptor stop plate. The susceptor support plate stop is receivable within the susceptor lift pin holes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to thermal processing of thin films on substrates, such as silicon wafers. More specifically, the embodiments of the disclosure relates to susceptor kits for thermally sensitive epitaxial deposition.

Figure 1:
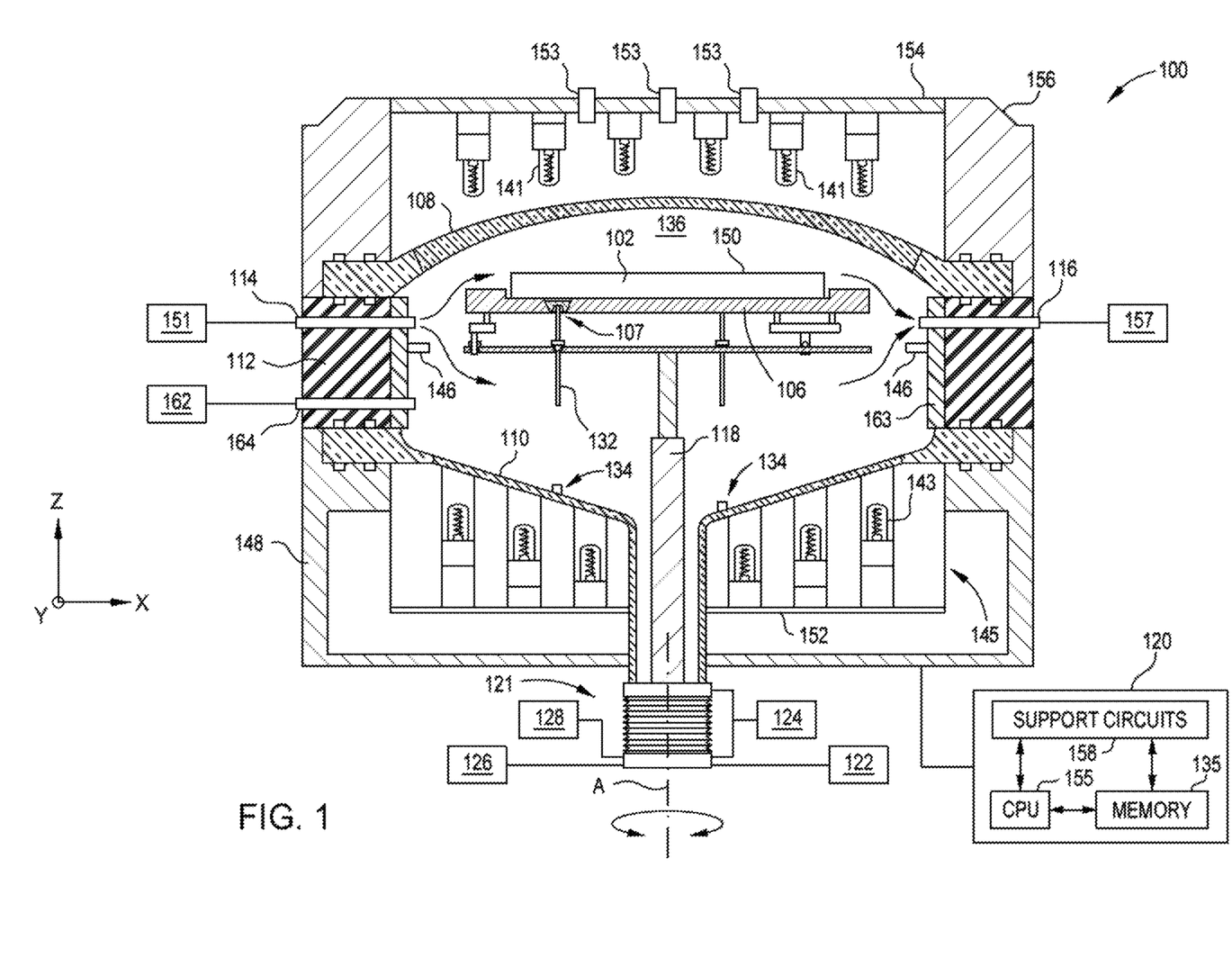
FIG. 1 is a schematic cross-section of an epitaxial system, according to embodiments of the disclosure.

FIG. 1 is a schematic cross-section of an epitaxial system 100 according to one embodiment of the present disclosure. The epitaxial system 100 is utilized to grow an epitaxial film on a substrate, such as the substrate 102. The epitaxial system 100 creates a cross-flow of precursors across the top surface 150 of the substrate 102.

The epitaxial system 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106 (e.g. a susceptor), an upper window 108 (e.g., dome), a lower window 110 (e.g., dome), a plurality of upper lamps 141, and a plurality of lower lamps 143.

A controller 120 is in communication with the epitaxial system 100 and is used to control processes, such as those described herein. The controller 120 is configured to receive data or input as sensor readings from the epitaxial system 100. The controller 120 is equipped with or in communication with a system model of the epitaxial system 100. The system model includes an epitaxial deposition model. The system model is a program configured to monitor the deposition process within the epitaxial system 100 throughout a deposition process. The epitaxial system 100 is further configured to store readings and calculations in the memory 135.

The readings and calculations include previous sensor readings as well as any other previous sensor readings within the epitaxial system 100. The readings and calculations further include the stored calculated values from after the sensor readings are measured by the sensors 153 within the epitaxial system 100 and run through the system model. Therefore, the controller 120 is configured to both retrieve stored readings and calculations as well as save readings and calculations in the memory 135 for future use. Maintaining previous readings and calculations in the memory 135 enables the controller 120 to adjust the system model over time to reflect a more accurate version of the epitaxial system 100.

In embodiments described herein, the controller 120 includes a programmable central processing unit (CPU) 155 that is operated with the memory 135 and a display unit (not shown). The controller 120 monitors the deposition, gas flow, temperature, and actuation of the shaft 118 within the epitaxial system 100. Support circuits 158 are coupled to the CPU 155 for supporting the processor in a conventional manner. In some embodiments, the controller 120 includes multiple controllers 120, such that the stored readings and calculations and the system model are stored within a separate controller 120 from the controller 120, which operates the epitaxial system 100. In other embodiments, all of the system model and the stored readings and calculations are saved within the controller 120.

The controller 120 is configured to control the deposition, gas flow, temperature, and actuation of the shaft 118 within the epitaxial system 100. The controller 120 is configured to adjust the aspects of the epitaxial system 100 based off the sensor readings, the system model, and the stored readings and calculations. The controller 120 includes embedded software and a compensation algorithm to calibrate deposition, gas flow, temperature, and actuation of the shaft 118 within the epitaxial system 100. The controller 120 may include a machine-learning algorithm and may use a regression or clustering technique. The algorithm is an unsupervised or a supervised algorithm.

The substrate support 106 is disposed between the upper window 108 and the window 110. The plurality of upper lamps 141 are disposed between the upper window 108 and a lid 154. The lid 154 includes a plurality of sensors 153 disposed therein for measuring the temperature within the epitaxial system 100. The plurality of lower lamps 143 are disposed between the lower window 110 and a floor 152. The plurality of lower lamps 143 form a lower lamp assembly 145.

A processing volume 136 is formed between the upper window 108 and the lower window 110. The processing volume 136 has the substrate support 106 disposed therein. The substrate support 106 includes a top surface on which the substrate 102 is disposed. The substrate support 106 is attached to a shaft 118. The shaft 118 is connected to a motion assembly 121. The motion assembly 121 includes one or more actuators and/or adjustment devices that provide movement and/or adjustment of the shaft 118 and/or the substrate support 106 within the processing volume 136. The motion assembly 121 includes a rotary actuator 122 that rotates the shaft 118 and/or the substrate support 106 about a longitudinal axis A of the epitaxial system 100. The motion assembly 121 further includes a vertical actuator 124 to lift and lower the substrate support 106 in the z-direction. The motion assembly 121 includes a tilt adjustment device 126 that is used to adjust the planar orientation of the substrate support 106 and a lateral adjustment device 128 that is used to adjust the position of the shaft 118 and the substrate support 106 side to side within the processing volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a processing position to a transfer position.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides 146 are disposed below the plurality of process gas inlets 114 and the one or more exhaust gas outlets 116. The flow guide 146 is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface 150 of a substrate 102 disposed within the processing volume 136. The process gas inlets 114 are fluidly connected to a process gas source 151. The purge gas inlets 164 are fluidly connected to a purge gas source 162. The one or more exhaust gas outlets 116 are fluidly connected to an exhaust pump 157. Each of the process gas source 151 and the purge gas source 162 may be configured to supply one or more precursors or process gases into the processing volume 136.

Figure 2:
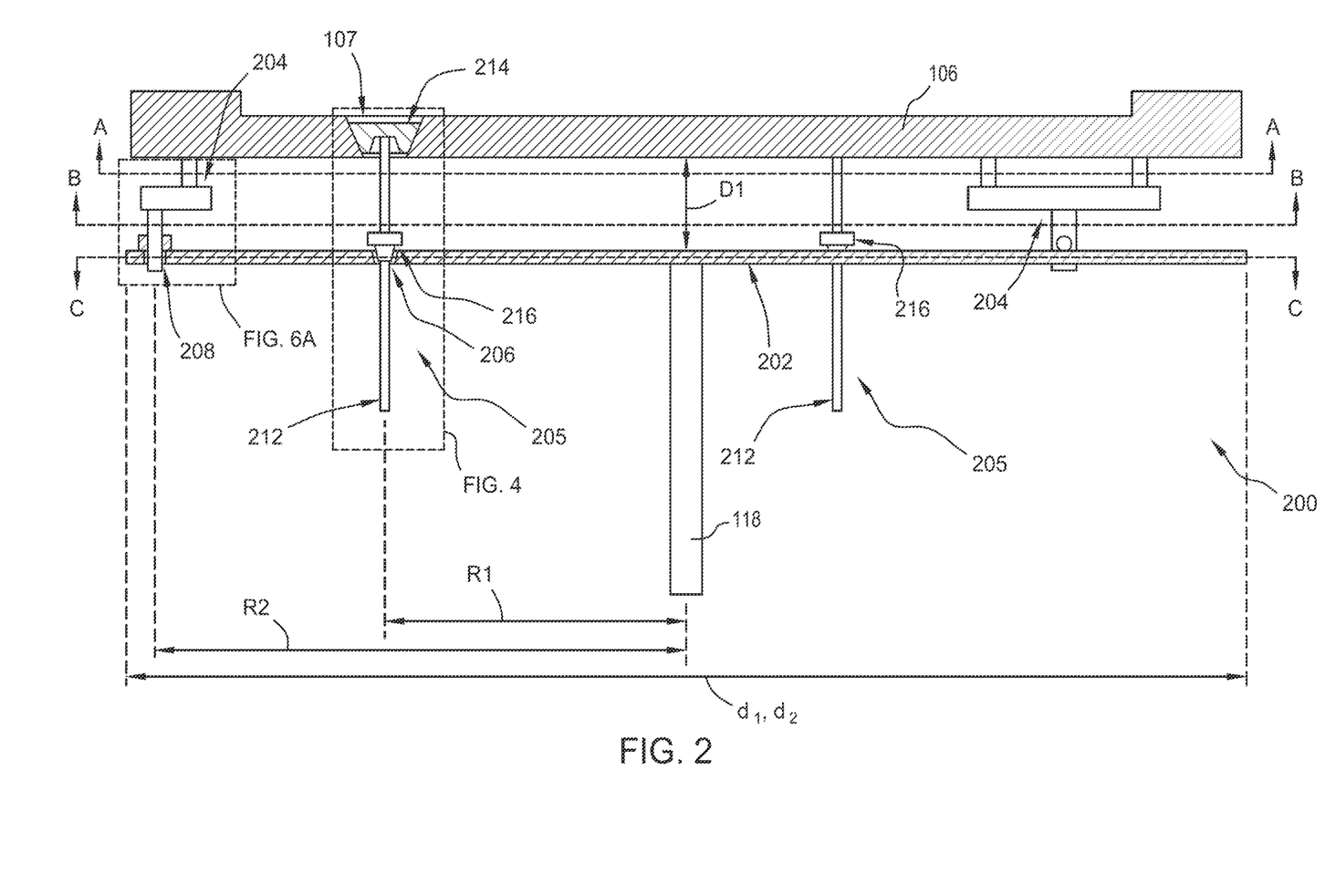
FIG. 2 is a schematic cross section of a susceptor kit, according to embodiments of the disclosure.

FIG. 2 is a schematic cross-section of a susceptor kit 200 coupled to the substrate support 106. The susceptor kit 200 includes a susceptor support plate 202 attaches to the shaft 118 between the shaft 118 and the substrate support 106. The susceptor support plate 202 supports the substrate support 106 within the processing volume 136, as shown in FIG. 1, of the epitaxial system 100. A distance D1 from the top surface of the susceptor support plate 202 to the bottom surface of the substrate support 106 is between about 20 mm and about 40 mm. The susceptor kit 200 further includes a plurality of susceptor supports 204 and a lift pin assembly 205. The susceptor supports 204 are received within a plurality of susceptor support holes 208 of the susceptor support plate 202. The susceptor supports 204 couple the susceptor support plate 202 the substrate support 106. The lift pin assembly 205 further includes a susceptor lift pin 212 including a lift pin cap 214 and a susceptor support plate stop 216. In one embodiment, the lift pin cap 214 and the susceptor support plate stop 216 have inverted frustoconical shapes. The lift pin cap 214 is received within the plurality of susceptor lift pin holes 107 of the substrate support 106 and the susceptor support plate stop 216 is received within a plurality of susceptor lift pin holes 206 of the susceptor support plate 202. The lift pin holes 107 have a corresponding inverted frustoconical shape to receive the inverted frustoconical shape of the lift pin cap 214. The susceptor support plate lift pin holes 206 have a corresponding inverted frustoconical shape to receive the susceptor lift pins 212. The susceptor support plate 202 has a thickness t of between about 2 mm and about 5 mm. The susceptor support plate 202 further includes a diameter $d_1$ of between about 200 mm and about 500 mm. The diameter $d_1$ of the susceptor support plate 202 is approximately equal to a diameter $d_2$ of the substrate support. In one embodiment, the susceptor support plate 202 include a material with high UV light transmission (T), e.g., a material through which UV light can travel efficiently. In one embodiment, the material has a T>80%. In one embodiment, the material with high UV transmission includes a quarts material.

Figure 3A:
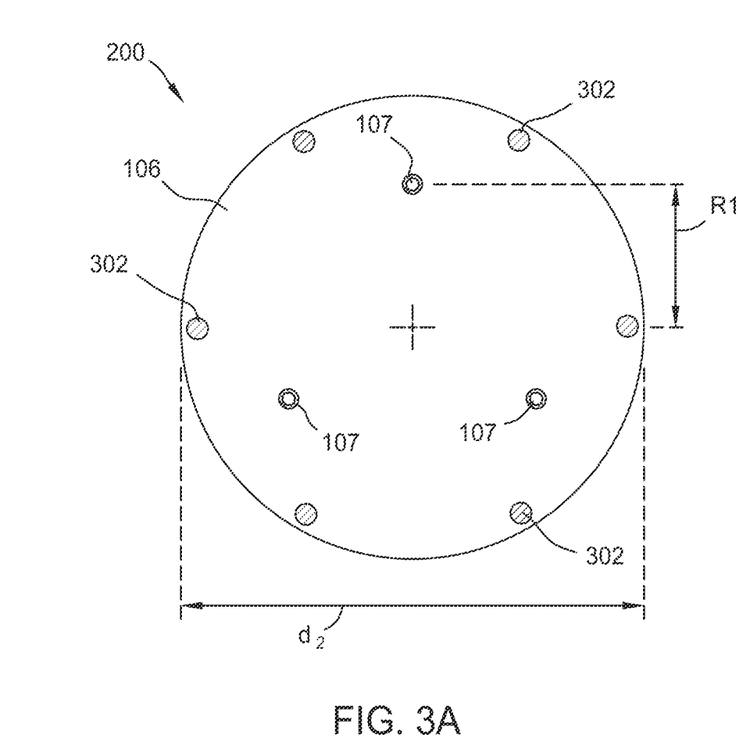
FIG. 3A is a schematic cross-section of the susceptor kit at cut line A-A, according to embodiments of the disclosure.

FIG. 3A is a schematic cross-section of the susceptor kit 200 at cut line A-A. The susceptor supports 204 includes a plurality of susceptor support pins 302. The susceptor support pins 302 are positioned radially from the center of the susceptor support plate 202 (shown in FIGS. 3B and 3C) about a perimeter of the susceptor support plate 202 to contact the edge of the substrate support 106. In the illustrated embodiment, each susceptor support 204 (shown in FIG. 2) includes two susceptor support pins 302, and the susceptor support pins 302 are positioned radially about every 60°. The six points of contact help to distribute thermal contact with the substrate support 106 and assist in positioning (e.g., centering) the substrate support 106 within the processing volume 136. In the illustrated embodiment, the lift pin holes 107 are positioned radially about every 120° such that the lift pin hole 107 is between every other susceptor support pin 302. Other radially spacing, however, are contemplated by this disclosure. The lift pin holes 107 are a radial distance R1 from the center of the substrate support 106 of between about 100 mm and about 120 mm. The susceptor support pins 302 include a silicon carbide material, however, other materials are also contemplated.

Figure 3B:
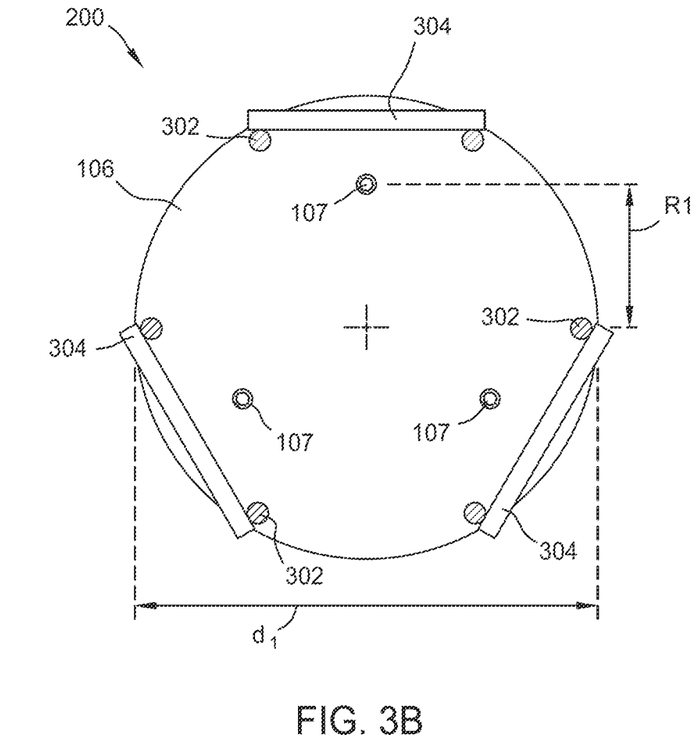
FIG. 3B is a schematic cross-section of the susceptor kit at cut line B-B, according to embodiments of the disclosure.
Figure 6A:
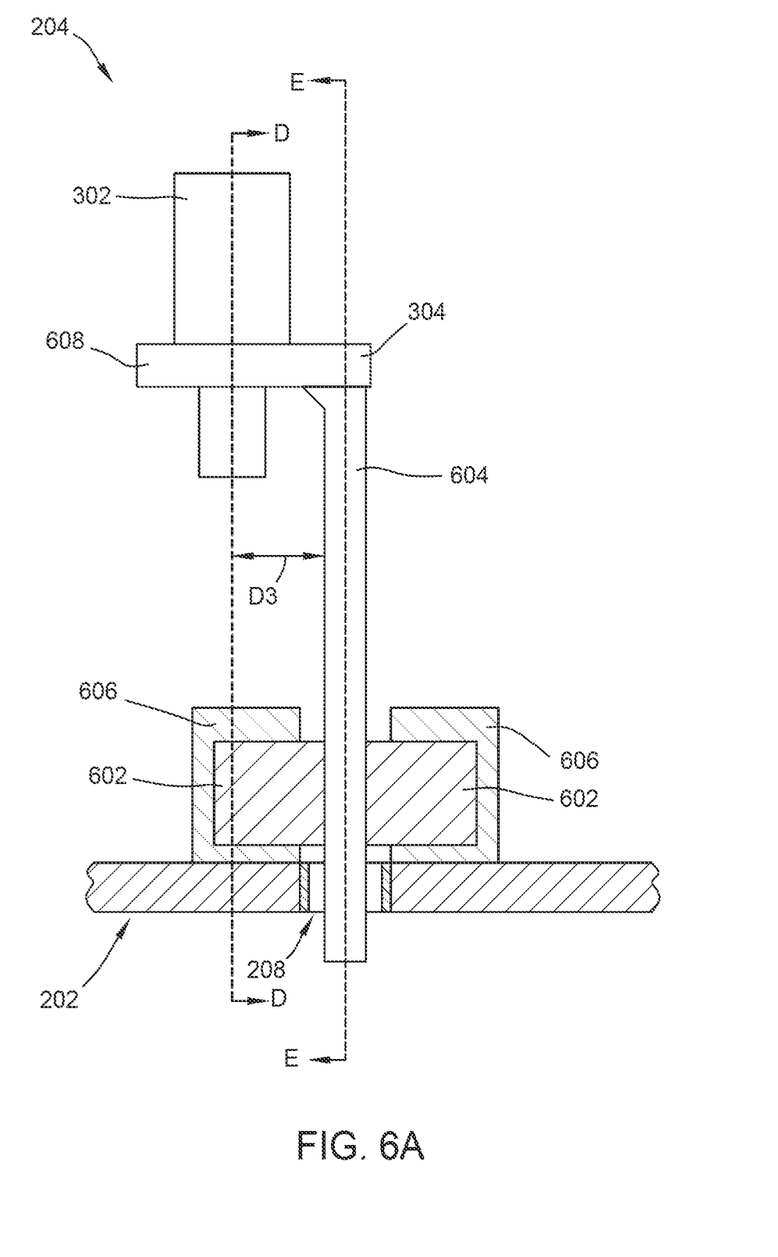
FIG. 6A is a schematic cross-section of the susceptor support, according to embodiments of the disclosure.
Figure 6B:
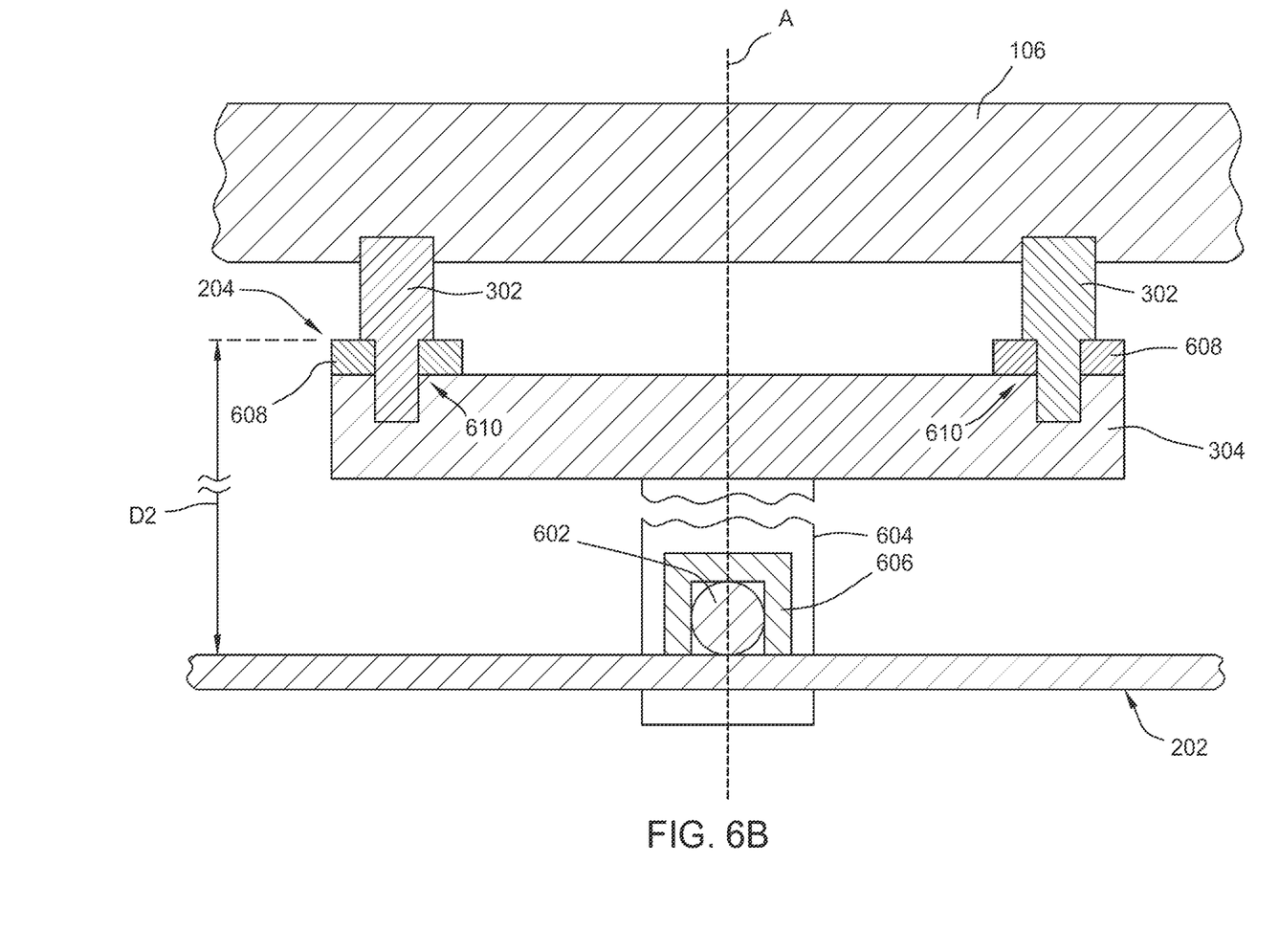
FIG. 6B is a schematic cross-section of the susceptor support at a cutline D-D, according to embodiments of the disclosure.
Figure 6C:
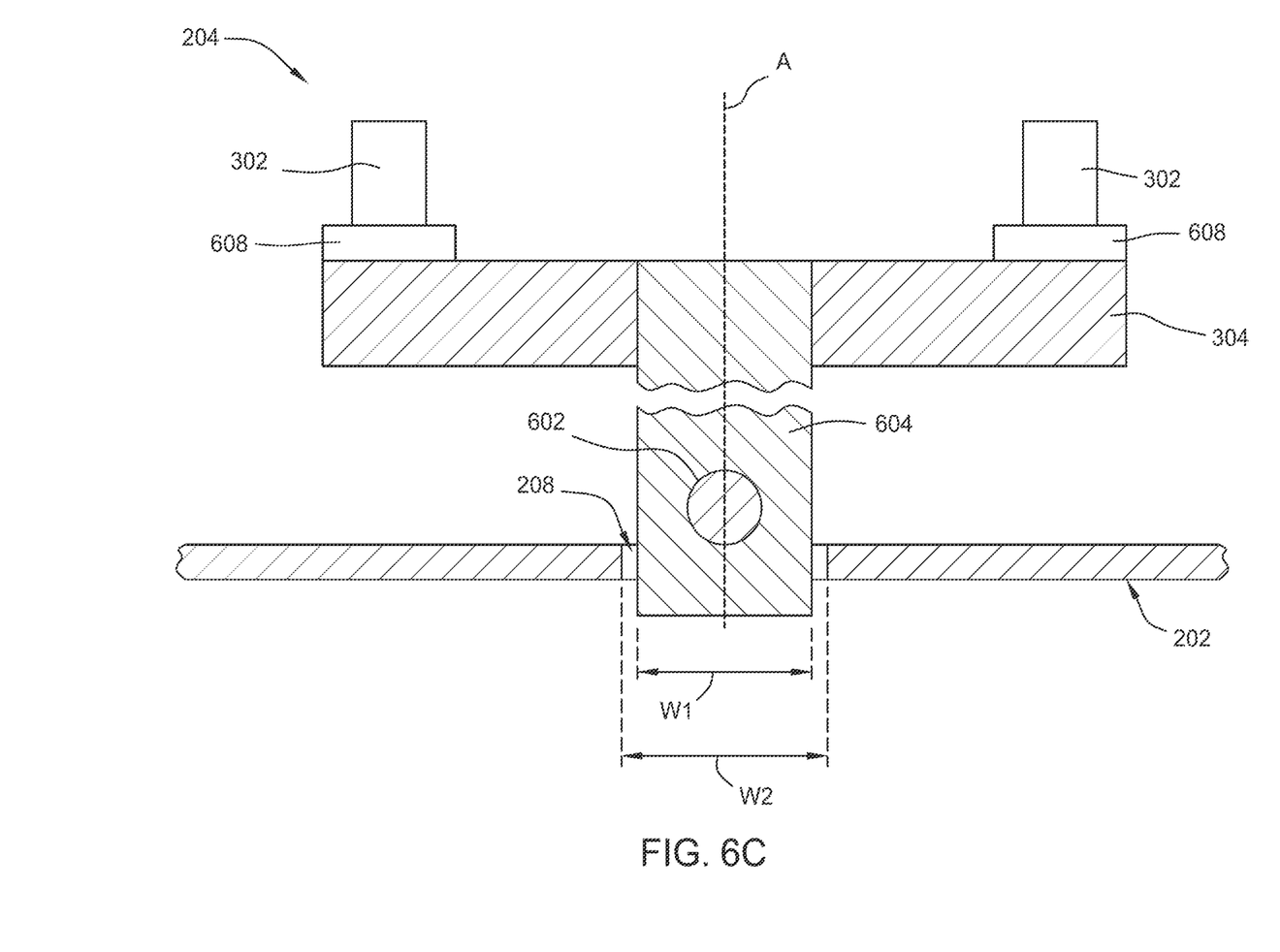
FIG. 6C is a schematic cross-section of the susceptor support at cutline E-E, according to embodiments of the disclosure.

FIG. 3B is a schematic cross-section of the susceptor kit 200 at cut line B-B. The susceptor support 204 further comprises a support pin link 304. The support pin link 304 spans between the two susceptor support pins 302 per each susceptor support 204, as shown in FIG. 6A-6C, and receives the susceptor support pins 302. The susceptor support 204 further comprises a support body 604, as shown in FIG. 6A-6C. The support body 604 supports the support pin link 304 in spaced apart relation to the susceptor support plate 202.

Figure 3C:
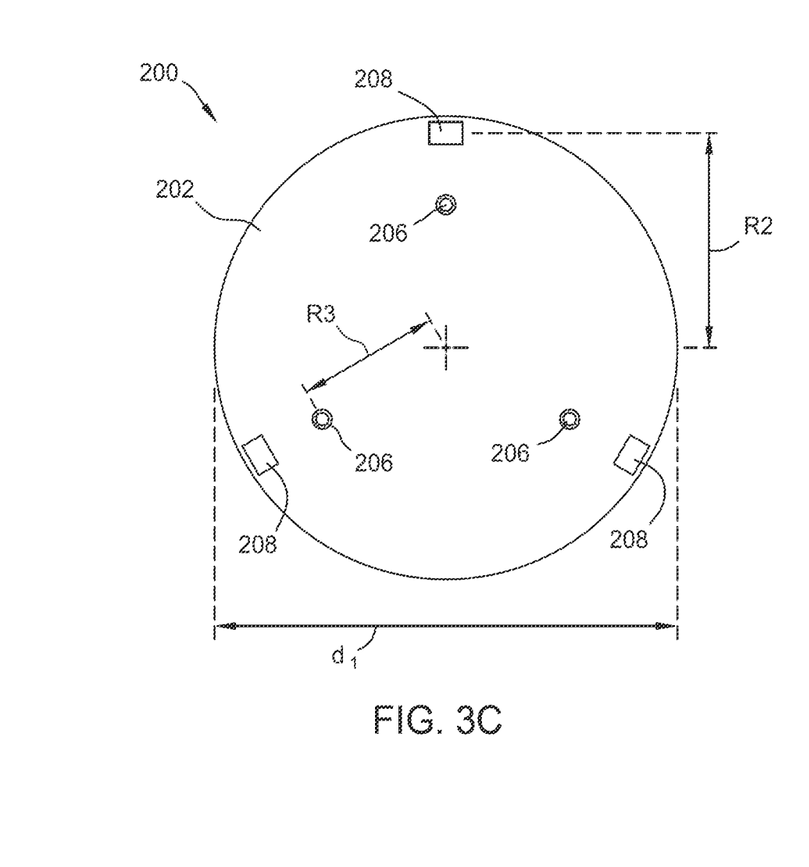
FIG. 3C is a schematic cross-section of the susceptor support plate at cut line C-C, according to embodiments of the disclosure.

FIG. 3C is a schematic cross-section of the susceptor support plate 202 at cut line C-C. The susceptor support plate 202 further includes susceptor support holes 208 which receive the susceptor supports 204. In the illustrated embodiment, the susceptor support holes 208 and the susceptor support plate lift pin holes 210 is are radially aligned and positioned radially about every 120°. Other radially spacing, however, is contemplated by this disclosure. The susceptor support holes 208 are a radial distance R2 from the center of the susceptor support plate 202 of between about 165 mm and about 185 mm. The susceptor lift pin holes 206 are a radial distance R3 from the center of the susceptor support plate 202 of between about 100 mm and about 120 mm. The radial distance R1 and R3 are substantially the same, e.g., +/−about 1 mm.

Figure 4:
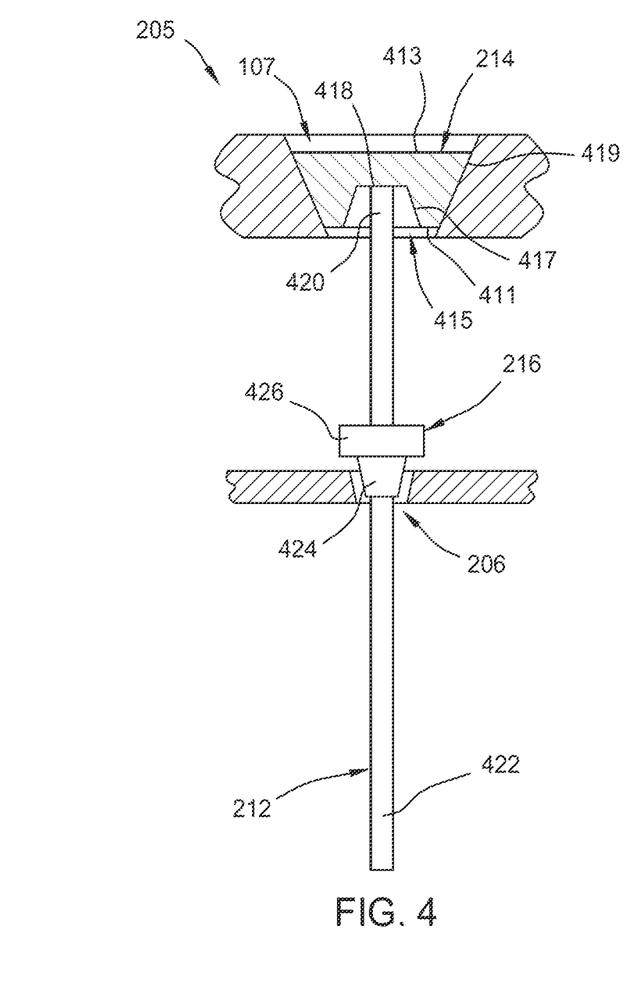
FIG. 4 is a schematic cross-section of the lift pin assembly, according to embodiments of the disclosure.

FIG. 4 is a schematic cross-section of the lift pin assembly 205. The lift pin cap 214 is an inverted frustoconical body and includes a bottom surface 411 and a top surface 413. The top surface 413 of the lift pin cap 214 is substantially flat in order to facilitate even contact with the substrate 102. The bottom surface 411 includes a lift pin alignment hole 415 to receive the susceptor lift pin 212. In one embodiment, the lift pin alignment hole 415 has a tapered design, with the sidewalls 417 of the lift pin alignment hole 415 tapering outward away from the top 418 of the lift pin alignment hole 415 toward the bottom surface 411 of the lift pin alignment hole 415. The tapered design of the lift pin alignment hole 415 allows for the susceptor lift pin 212 to easily align with the lift pin alignment hole 415. The lift pin cap 214 further includes flared sidewalls 419. The flared sidewall 419 flare outward from the bottom surface 411 toward the top surface 413 such that the diameter of the lift pin cap 214 increases from the bottom surface 411 to the top surface 413. The flared sidewalls 419 align the lift pin cap 214 with the lift pin holes 107 and prevent the lift pin cap 214 from passing through the lift pin holes 107 of the substrate support 106. In one embodiment, the lift pin cap 214 includes a material that thermally matches the material of the substrate support 106, e.g., the material of the lift pin cap 214 includes silicon carbide or silicon carbide coated graphite.

A first end 420 of the susceptor lift pin 212 is received within the lift pin alignment hole 415. A second end 422 of the susceptor lift pin 212 is opposite the first end 420 of the susceptor lift pin 212. The susceptor support plate stop 216 is configured between the first end 420 and second end 422 of the susceptor lift pin 212. The susceptor support plate stop 216 further includes a flared portion 424 and a stop portion 426. The flared portion 424 is oriented toward the second end 422 of the susceptor lift pin 212, while the stop portion 426 is oriented toward the first end 420 of the susceptor lift pin 212. The flared portion 424 flares outwards toward the stop portion 426 of the susceptor lift pin 212. The flared portion 424 of the susceptor support plate stop 216 aligns the susceptor support plate stop 216 with the plurality of susceptor lift pin holes 206. The stop portion 426 of the susceptor support plate stop 216 prevents the susceptor lift pin 212 from passing through the plurality of susceptor lift pin holes 206.

The second end 422 of the susceptor lift pin 212 is engaged by the lift pin stops 134 when the susceptor support plate 202 is lowered from a processing position to a transfer position within the processing volume 136. As the susceptor support plate continues to be lowered in the processing volume, the first end 420 of the susceptor lift pin 212 is received in the lift pin alignment hole 415 and engages the top 418 of the lift pin alignment hole 415. The susceptor lift pin 212 forces the top surface 413 of the lift pin cap 214 to engage the substrate 102, moving the substrate 102 off the substrate support 106. The lift pin cap 214, when engaged by the susceptor lift pins 212, may lift the substrate 102 from the substrate support 106 before a deposition process in order to facilitate alignment of the substrate 102 by a robot arm on the substrate support 106. The lift pin cap 214, when engaged by the susceptor lift pins 212, may also lift the substrate 102 from the substrate support 106 after a deposition process to position the processed substrate 102 to be removed from the processing volume 136 by the robot and replaced by a substrate 102 that is to be processed within the processing volume 136. The susceptor lift pins 212 may rest on lift pin stops 134 when the substrate support 106 is lowered from the processing position to the transfer position. While in the processing position, the susceptor lift pin 212 is not engaged with the lift pin cap 214. The lift pin cap 214 is recessed within the lift pin holes 107 while in the processing position, such that the lift pin cap 214 is not in contact with the substrate 102.

In one embodiment, the susceptor lift pins 212 and the lift pin stops 134 include a material with high UV light transmission (T), e.g., a material through which UV light can travel efficiently. In one embodiment, the material has a T>80%. In one embodiment, the material with high UV transmission includes a quarts material.

Figure 5:
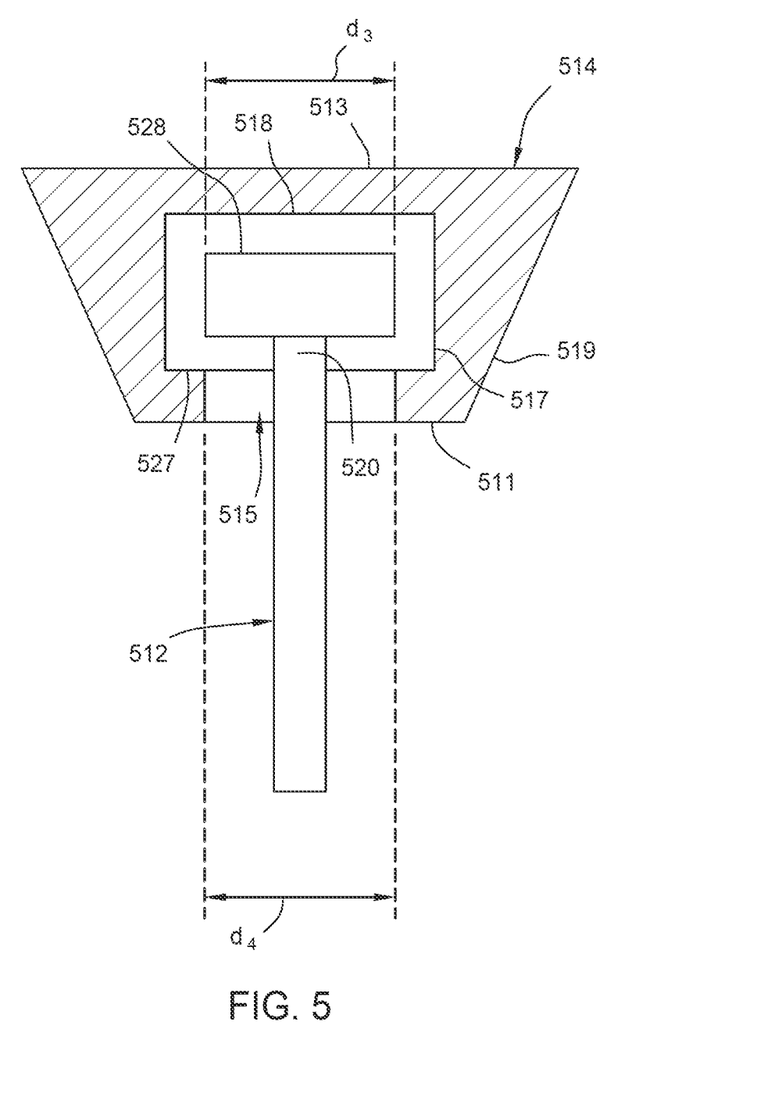
FIG. 5 is a schematic cross-section of an alternative lift pin cap and alternative susceptor lift pin, according to embodiments of the disclosure.

FIG. 5 is a schematic cross-section of an alternative lift pin cap 514 and alternative susceptor lift pin 512. The lift pin cap 514 may be used in place of lift pin cap 214, and susceptor lift pin 512 may be used in place of susceptor lift pin 212. The lift pin cap 514 includes sidewalls 519, top surface 513, and bottom surface 511. The bottom surface 511 has a lift pin alignment hole 515 to receive the susceptor lift pins 512. The lift pin alignment hole is defined by a top 518 of the lift pin alignment hole 515, sidewalls 517 of the lift pin alignment hole 515, and bottom lip 527 of the lift pin alignment hole 515. The sidewalls 517, top 518, and bottom lip 527 form a generally circular cavity. The susceptor lift pin 512 further includes a first end cap 528 at a first end 520 of the susceptor lift pin 512. The first end cap 528 is received in the lift pin alignment hole 515 in order to engage the top 518 of the lift pin cap 514. The diameter $d_3$ of the first end cap 528 is substantially the same as the diameter $d_4$ of the lift pin alignment hole 515, e.g., +/−0.1 mm. The first end cap 528 is capable of being inserted into the lift pin alignment hole 515 when the two are aligned. If the first end cap 528 and lift pin alignment hole 515 are not aligned, the first end cap 528 will not fit into the lift pin alignment hole 515. When the alternative susceptor lift pin 512 is in the processing position, e.g., when the lift pin cap 514 is recessed in the lift pin holes 107, the susceptor lift pin is held within the lift pin cap 514 by the first end cap 528. In this embodiment, the susceptor support plate stops 216 are not used.

The first end cap 528 of susceptor lift pin 512 forces the top surface 513 of the lift pin cap 514 to engaged the substrate 102, moving the substrate 102 off the substrate support 106. The susceptor lift pins 512 may lift the substrate 102 from the substrate support 106 before a deposition process in order to align the substrate 102 on the substrate support 106. The susceptor lift pins 512 may also lift the substrate 102 from the substrate support 106 after a deposition process to position the processed substrate 102 to be removed from the processing volume 136 by a robot and replaced by a substrate that is to be processed within the processing volume 136.

In one embodiment, the susceptor lift pins 512 include a material with high UV light transmission (T), e.g., a material through which UV light can travel efficiently. In one embodiment, the material has a T>80%. In one embodiment, the material with high UV transmission includes a quarts material. In one embodiment, the lift pin cap 514 includes a material that thermally matches the material of the substrate support 106, e.g., the material of the lift pin cap 514 includes silicon carbide or silicon carbide coated graphite.

FIG. 6A is a schematic cross-section of the susceptor support 204. FIG. 6B is a schematic cross-section of the susceptor support 204 at a cutline D-D. FIG. 6C is a schematic cross-section of the susceptor support 204 at cutline E-E. The susceptor support 204 includes the susceptor support pins 302, the support pin link 304, a support connector 602, and a support body 604. The support body 604 is partially recessed in the susceptor support holes 208 and secured to the susceptor support plate 202 with the support connector 602 (i.e., a pin). The support connector 602 passes through the support body 604 above the susceptor support hole 208. The susceptor support plate 202 further includes a plurality of support anchors 606 on an inner side and an outer side of the susceptor support holes 208. The inner side of the susceptor support hole 208 is the side of the susceptor support hole 208 nearest the center of the susceptor support plate 202, while the outer side of the susceptor support hole 208 is the side of the susceptor support hole 208 that is furthest from the center of the susceptor support plate 202. The support anchors 606 receive the exposed ends of the support connector 602 in a pivot connection in order to secure the susceptor supports 204 to the susceptor support plate 202. The support anchors 606 include a cavity to receive the support connector 602. The support body 604 is sized relative to the susceptor support hole 208 in order to allow the susceptor support 204 to pivot within the susceptor support hole 208. The susceptor support 204 pivots about an axis A between about +/−5°. The ability of the susceptor support 204 to pivot allows for the susceptor support pins 302 to maintain six-point contact with the substrate support 106. The width W1 of the support body 604 (shown in FIG. 6C) is between about 10 mm and about 30 mm. The width W2 of the susceptor support holes 208 is between about 12 mm and about 32 mm. The difference between the width W2 and the width W1 should be about +/−2 mm.

The support body 604 extends away from the susceptor support plate 202 and toward the substrate support 106. support The support pin link 304 further includes a pin flange 608. The pin flange 608 extends orthogonally from the support pin link 304 and support body 604 toward the center of the susceptor support plate 202. The pin flange 608 further has a support pin hole 610 for receiving the susceptor support pins 302 (as shown in FIG. 6B). A distance D2 from the top surface of the susceptor support plate 202 to the top of the pin flange 608 (as shown in FIG. 6B) is between about 20 mm and about 40 mm. A distance D3 between the support body 604 and a midpoint of the support pin hole 610 (as shown in FIG. 6A) is between about 10 mm and about 15 mm.

In one embodiment, the components of the susceptor support 204 and support anchors 606 include a material with high UV light transmission (T), e.g., a material through which UV light can travel efficiently. In one embodiment, the material has a T>80%. In one embodiment, the material with high UV transmission includes a quarts material.

The use of material with high UV transmission for the components of the susceptor kit 200 helps to eliminate the shadowing effect of the components on the substrate support 106. More uniform heating of the substrate support 106 leads to more uniform heating of the substrate 102, allowing for more uniform deposition over the substrate, i.e., a thickness uniformity range of less than 1%.

In summary, a susceptor kit includes a susceptor support plate, a plurality of susceptor supports, and a lift pin assembly. The susceptor support plate includes a plurality of susceptor lift pin holes and a plurality of susceptor support holes. The plurality of susceptor supports are recessed within the plurality of susceptor support holes and coupled to the susceptor support plate. The plurality of susceptor supports each include two or more susceptor support pins to support a substrate support. The susceptor lift pin assembly received in the plurality of susceptor lift pin holes.

In another embodiment, a susceptor kit includes a susceptor support plate, a plurality of susceptor supports, and a lift pin assembly. The susceptor support plate includes a plurality of susceptor lift pin holes and a plurality of susceptor support holes. The plurality of susceptor supports are recessed within the plurality of susceptor support holes and are coupled to the susceptor support plate. Each of the plurality of susceptor supports include two or more susceptor support pins support a substrate support. The lift pin assembly receives in the plurality of susceptor lift pin holes.

In another embodiment, a susceptor kit includes a susceptor support plate including a plurality of susceptor lift pin holes and a plurality of susceptor support holes, a plurality of susceptor supports recessed within the plurality of susceptor support holes and coupled to the susceptor support plate, and a lift pin assembly. The plurality of susceptor supports include a support body and a support pin link. A support connector is received by a support anchor of the susceptor support plate to secure the support body to the susceptor support plate. The support pin link receives a plurality of susceptor support pins. The support body supports the support pin link in a spaced apart relation to the susceptor support plate. The lift pin assembly is received in the plurality of susceptor lift pin holes. The lift pin assembly includes a lift pin cap and a susceptor lift pin comprising a susceptor stop plate. The susceptor support plate stop is receivable within the susceptor lift pin holes.

While the foregoing is directed to embodiments of the present disclosure, other and further embodiments of the disclosure may be devised without departing from the basic scope thereof, and the scope thereof is determined by the claims that follow.

What is claimed is:

1. A susceptor kit, the susceptor kit comprising:
   a susceptor support plate comprising a plurality of susceptor lift pin holes and a plurality of susceptor support holes;
   a plurality of susceptor supports, each susceptor support of the plurality of susceptor supports recessed within a respective susceptor support hole of the plurality of susceptor support holes and coupled to the susceptor support plate, the plurality of susceptor supports each comprising a plurality of susceptor support pins to support a substrate support, wherein each susceptor support of the plurality of susceptor supports further comprises a support body and a support pin link, wherein a support connector is received by a support anchor of the susceptor support plate to secure the support body to the susceptor support plate, and wherein the support pin link receives the susceptor support pins, the support body supports the support pin link in spaced apart relation to the susceptor support plate; and
   a lift pin assembly received in each susceptor lift pin hole of the plurality of susceptor lift pin holes.

2. The susceptor kit of claim 1, wherein each two adjacent susceptor support holes of the plurality of susceptor support holes are radially spaced 120 degrees apart and each two adjacent susceptor supports of the plurality of susceptor supports are radially spaced 120 degrees apart.

3. The susceptor kit of claim 1, wherein each two adjacent susceptor support pins of the plurality of susceptor support pins are positioned radially 60 degrees apart about a perimeter of the susceptor support plate to contact an edge of the substrate support.

4. The susceptor kit of claim 1, wherein the susceptor support pins comprise silicon carbide.

5. The susceptor kit of claim 1, wherein the susceptor support plate, the susceptor supports, and the lift pin assembly comprise a material with a UV transmission of greater than 80%.

6. The susceptor kit of claim 5, wherein the material of the susceptor support plate, the susceptor supports, and the lift pin assembly is quartz.

7. The susceptor kit of claim 1, wherein a width W1 of the support body is between 10 mm and 30 mm and a width W2 of each susceptor support hole of the plurality of susceptor support holes is between 12 mm and 32 mm.

8. A susceptor kit, the susceptor kit comprising:
   a susceptor support plate comprising a plurality of susceptor lift pin holes and a plurality of susceptor support holes; and
   a plurality of susceptor supports, each susceptor support of the plurality of susceptor supports recessed within a respective susceptor support hole of the plurality of susceptor support holes and coupled to the susceptor support plate, the plurality of susceptor supports each comprising a plurality of susceptor support pins to support a substrate support, wherein each two adjacent susceptor support holes of the plurality of susceptor support holes are radially spaced 120 degrees apart, each two adjacent susceptor supports of the plurality of susceptor supports are radially spaced 120 degrees apart, and each two adjacent susceptor support pins of the plurality of susceptor support pins are positioned 60 degrees apart about a perimeter of the susceptor support plate to contact an edge of the substrate support, wherein each susceptor support of the plurality of susceptor supports pivots about an axis within each respective susceptor support hole of the plurality of susceptor support holes between +/−5°.

9. A susceptor kit, the susceptor kit comprising:
   a susceptor support plate comprising a plurality of susceptor lift pin holes and a plurality of susceptor support holes;
   a plurality of susceptor supports, each susceptor support of the plurality of susceptor supports recessed within a respective susceptor support hole of the plurality of susceptor support holes and coupled to the susceptor support plate, the plurality of susceptor supports each comprising a plurality of susceptor support pins to support a substrate support, wherein each two adjacent susceptor support holes of the plurality of susceptor support holes are radially spaced 120 degrees apart, each two adjacent susceptor supports of the plurality of susceptor supports are radially spaced 120 degrees apart, and each two adjacent susceptor support pins of the plurality of susceptor support pins are positioned 60 degrees apart about a perimeter of the susceptor support plate to contact an edge of the substrate support; and
   a lift pin assembly received in each susceptor lift pin hole of the plurality of susceptor lift pin holes.

10. The susceptor kit of claim 9, wherein the lift pin assembly further comprises a lift pin cap and a susceptor lift pin, the susceptor lift pin comprising a susceptor stop plate, wherein the susceptor stop plate further comprises a flared portion and a stop portion, the flared portion having sidewalls that flare outward toward the stop portion.

11. The susceptor kit of claim 10, wherein the lift pin cap has a top surface and a bottom surface, the bottom surface having a lift pin alignment hole.

12. The susceptor kit of claim 10, wherein the lift pin cap is comprised of a silicon carbide.

13. The susceptor kit of claim 9, wherein the susceptor support plate, the plurality of susceptor supports, and the plurality of susceptor lift pins comprise a material with a UV transmission of greater than 80%.

14. A susceptor kit, the susceptor kit comprising:
   a susceptor support plate comprising a plurality of susceptor lift pin holes and a plurality of susceptor support holes;

a plurality of susceptor supports, each susceptor support of the plurality of susceptor supports recessed within a respective susceptor support hole of the plurality of susceptor support holes and coupled to the susceptor support plate, the plurality of susceptor supports each comprising a support body and a support pin link, wherein a support connector is received by a support anchor of the susceptor support plate to secure the support body to the susceptor support plate, and wherein the support pin link receives a plurality of susceptor support pins, the support body supports the support pin link in a spaced apart relation to the susceptor support plate; and a lift pin assembly received in each susceptor lift pin hole of the plurality of susceptor lift pin holes, wherein the lift pin assembly further comprises a lift pin cap and a susceptor lift pin, the susceptor lift pin comprising a susceptor stop plate, wherein the susceptor stop plate is receivable within the susceptor lift pin holes.

15. The susceptor kit of claim 14, wherein a width W1 of the support body is between 10 mm and 30 mm and a width W2 of each susceptor support hole of the plurality of susceptor support holes is between 12 mm and 32 mm.

16. The susceptor kit of claim 14, wherein each susceptor support of the plurality of susceptor supports pivots about an axis within each respective susceptor support hole of the plurality of susceptor support holes between +/−5°.

17. The susceptor kit of claim 14, wherein the susceptor support plate, the plurality of susceptor supports, and the susceptor lift pin comprise a material with a UV transmission of greater than 80%.

18. The susceptor kit of claim 14, wherein each two adjacent susceptor support holes of the plurality of susceptor support holes are radially spaced 120 degrees apart, each two adjacent susceptor supports of the plurality of susceptor supports are radially spaced 120 degrees apart, and each two adjacent susceptor support pins of the plurality of susceptor support pins are positioned radially 60 degrees apart about a perimeter of the susceptor support plate to contact an edge of a substrate support.

19. A susceptor kit, the susceptor kit comprising:

a susceptor support plate comprising a plurality of susceptor lift pin holes and a plurality of susceptor support holes; and a plurality of susceptor supports, each susceptor support of the plurality of susceptor supports recessed within a respective susceptor support hole of the plurality of susceptor support holes and coupled to the susceptor support plate, the plurality of susceptor supports each comprising a plurality of susceptor support pins to support a substrate support, wherein each susceptor support of the plurality of susceptor supports further comprises a support body and a support pin link, wherein a support connector is received by a support anchor of the susceptor support plate to secure the support body to the susceptor support plate, and wherein the support pin link receives the susceptor support pins, the support body supports the support pin link in spaced apart relation to the susceptor support plate, wherein each susceptor support of the plurality of susceptor supports pivots about an axis within each respective susceptor support hole of the plurality of susceptor support holes between +/−5°.

20. The susceptor kit of claim 19, further comprising a lift pin assembly received in each susceptor lift pin hole of the plurality of susceptor lift pin holes.

* * * * *